(12) United States Patent
Thomas et al.

(10) Patent No.: US 8,013,399 B2
(45) Date of Patent: Sep. 6, 2011

(54) SRAM MEMORY CELL HAVING TRANSISTORS INTEGRATED AT SEVERAL LEVELS AND THE THRESHOLD VOLTAGE VT OF WHICH IS DYNAMICALLY ADJUSTABLE

(75) Inventors: Olivier Thomas, Revel (FR); Perrine Batude, Grenoble (FR); Arnaud Pouydebasque, Le Versoud (FR); Maud Vinet, Rives (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 12/466,733

(22) Filed: May 15, 2009

(65) Prior Publication Data

US 2009/0294861 A1 Dec. 3, 2009

(30) Foreign Application Priority Data

Jun. 2, 2008 (FR) ...................... 08 53608

(51) Int. Cl.
*H01L 27/088* (2006.01)
(52) U.S. Cl. ................. 257/393; 257/E27.099
(58) Field of Classification Search ........... 257/49, 257/66–71, 213, 288, 347–352, 368, 369, 257/393, E27.098, E27.099, E27.1
See application file for complete search history.

(56) References Cited

U.S. PATENT DOCUMENTS

| | | | |
|---|---|---|---|
| 5,548,153 A | 8/1996 | Muragishi | |
| 5,559,368 A | 9/1996 | Hu et al. | |
| 5,567,959 A | 10/1996 | Mineji | |
| 5,854,503 A * | 12/1998 | Hsueh et al. | ............. 257/347 |
| 7,115,950 B2 | 10/2006 | Tokushige | |
| 7,511,989 B2 | 3/2009 | Thomas et al. | |
| 2005/0179061 A1* | 8/2005 | Jang et al. | ............. 257/208 |
| 2005/0184292 A1 | 8/2005 | Kwak et al. | |
| 2005/0221544 A1 | 10/2005 | Kwak et al. | |

(Continued)

FOREIGN PATENT DOCUMENTS

EP 0 920 025 A1 6/1999

(Continued)

OTHER PUBLICATIONS

U.S. Appl. No. 12/474,851, filed May 29, 2009, Batude, et al.

(Continued)

*Primary Examiner* — Minh-Loan T Tran
*Assistant Examiner* — Kevin Quinto
(74) *Attorney, Agent, or Firm* — Oblon, Spivak, McClelland, Maier & Neustadt, L.L.P.

(57) ABSTRACT

A static random access memory cell which, on a substrate surmounted by a stack of layers, including: a first plurality of transistors situated at a given level of the stack of which at least one first access transistor and at least one second access transistor are connected to a word line and are arranged between a first bit line and a first storage node and a second bit line and a second storage node, respectively; and a second plurality of transistors forming a flip-flop and situated at least one other level of the stack, beneath said given level, wherein the transistors of the second plurality of transistors each comprising a gate electrode situated opposite a channel region of a transistor of the first plurality of transistors and separated from this channel region by an insulating region provided to enable coupling of said gate electrode and said channel region.

21 Claims, 10 Drawing Sheets

U.S. PATENT DOCUMENTS

| | | | |
|---|---|---|---|
| 2006/0062061 | A1 | 3/2006 | Suh et al. |
| 2007/0181880 | A1 | 8/2007 | Kim |
| 2009/0016095 | A1 | 1/2009 | Thomas et al. |
| 2009/0294861 | A1 | 12/2009 | Thomas et al. |

FOREIGN PATENT DOCUMENTS

| | | |
|---|---|---|
| EP | 1 705 693 A2 | 9/2006 |

OTHER PUBLICATIONS

Hyung-Kyu Lim, et al., "Threshold Voltage of Thin-Film Silicon-on-Insulator (SOI) MOSFET's", IEEE Transactions on Electron Devices, vol. ED-30, No. 10, Oct. 1983, pp. 1244-1251.

O. Thomas, et al., "Compact 6T SRAM Cell With Robust Read/Write Stabilizing Design in 45nm Monolithic 3D IC Technology", May 2009, pp. 1-4.

P. Batude, et al., "3D CMOS Integration: Introduction of Dynamical Coupling and Application to Compact and Robust 4T SRAM", May 2008, pp. 1-4.

Tetsu Ohtou, et al., "Variable-Body-Factor SOI MOSFET With Ultrathin Buried Oxide for Adaptive Threshold Voltage and Leakage Control", IEEE Transactions on Electron Devices, vol. 55, No. 1, Jan. 2008, pp. 40-47.

Hoon Lim, et al., "65nm High Performance SRAM Technology with $25F^2$, $0.16um^2S^3$ (Stacked Single-crystal Si) SRAM Cell, and Stacked Peripheral SSTFT for Ultra High Density and High Speed Applications", Proceedings of ESSDERC, 2005, pp. 549-552.

Ryuta Tsuchiya, et al., "Controllable Inverter Delay and Suppressing $V_{th}$ Fluctuation Technology in Silicon on Thin BOX Featuring Dual Back-Gate Bias Architecture", Electron Devices Meeting, IEDM, IEEE International, Dec. 10-12, 2007, pp. 475-478.

Yuuichi Hirano, et al., "A Novel Low-Power and High-Speed SOI SRAM With Actively Body-Bias Controlled (ABC) Technology for Emerging Generations", IEEE Transactions on Electron Devices, vol. 55. No. 1, Jan. 2008, pp. 365-371.

Fariborz Assaderaghi, et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.

Soon-Moon Jung, et al., "Highly Cost Effective and High Performance 65nm $S^3$ (Stacked Single-crystal Si) SRAM Technology with $25F^2$, $0.16um^2$ Cell and Doubly Stacked SSTFT Cell Transistors for Ultra High Density and High Speed Applications", Symposium on VLSI Technology Digest of Technical Papers, Jun. 2005, pp. 220-221.

Yong-Hoon Son, et al., "Laser-Induced Epitaxial Growth (LEG) Technology for High Density 3-D Stacked Memory with High Productivity", Symposium on VLSI Technology Digest of Technical Papers, Jun. 12-14, 2007, pages 80-81.

U.S. Appl. No. 12/740,907, filed Apr. 30, 2010, Thomas, et al.
U.S. Appl. No. 12/866,821, filed Aug. 9, 2010, Thomas, et al.

* cited by examiner

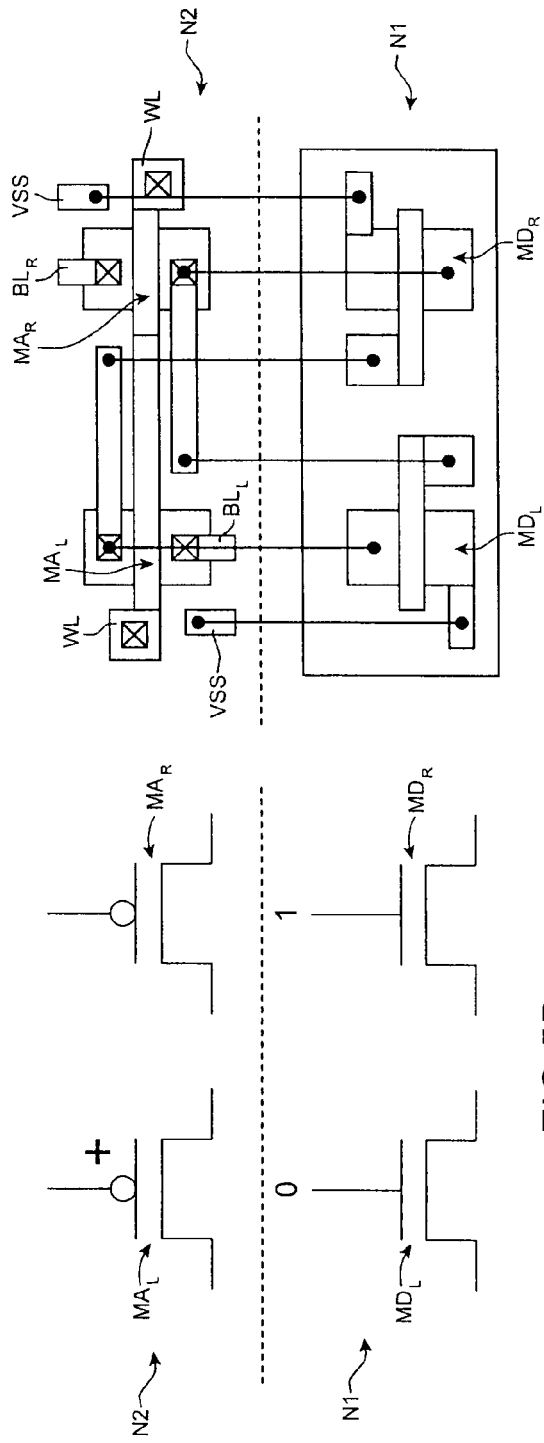
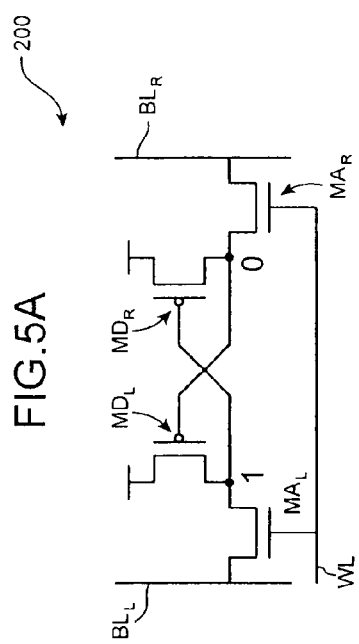
FIG.5A
FIG.5B
FIG.5C

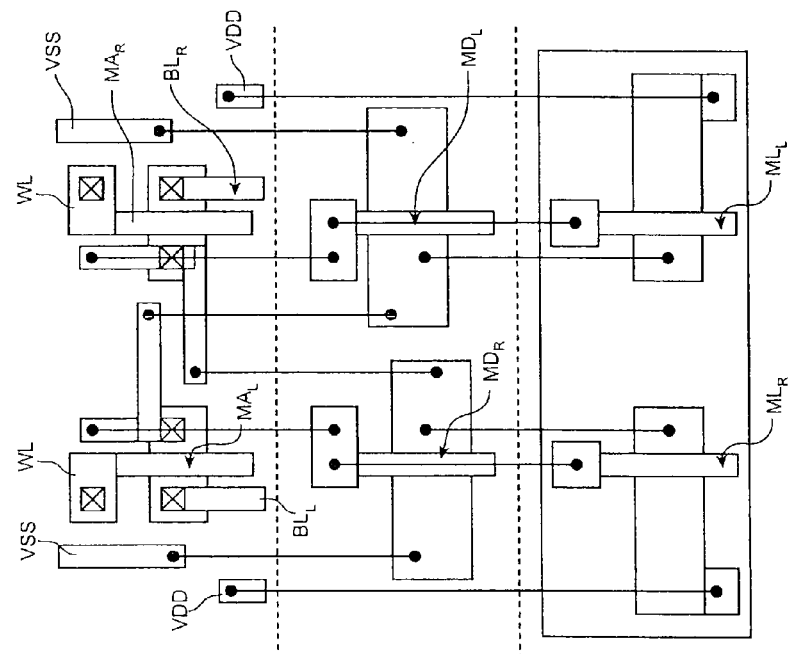
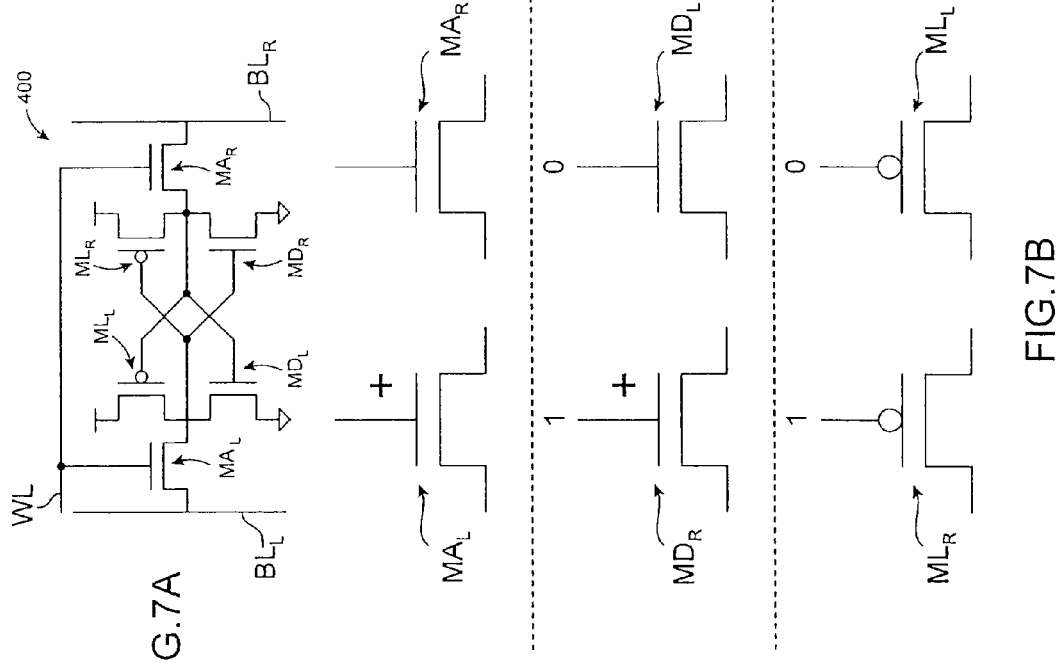
FIG.7A  FIG.7B  FIG.7C

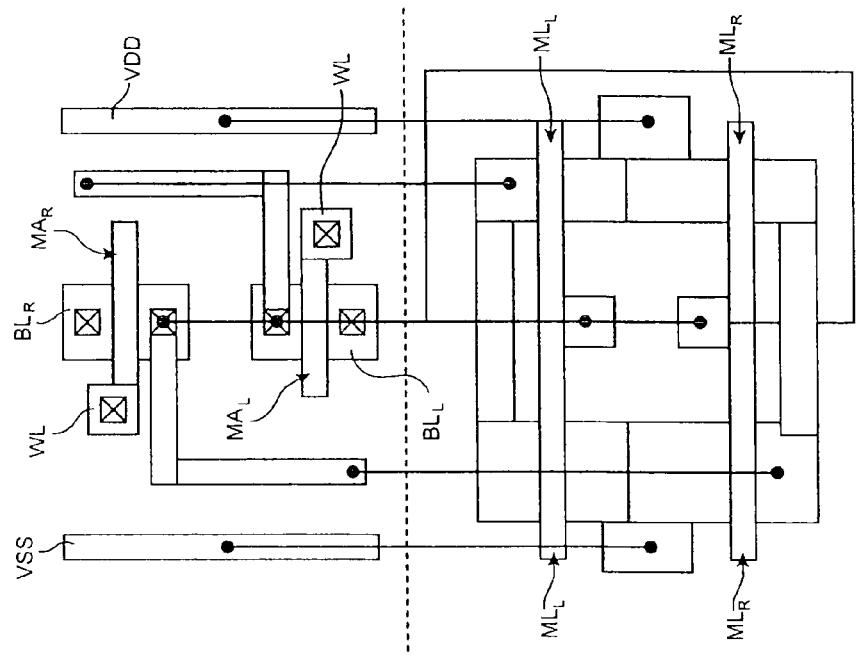
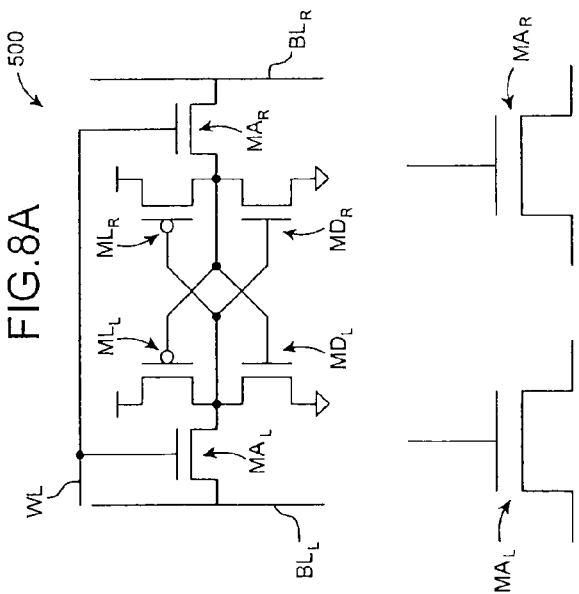
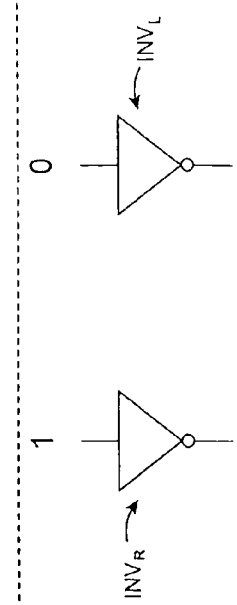

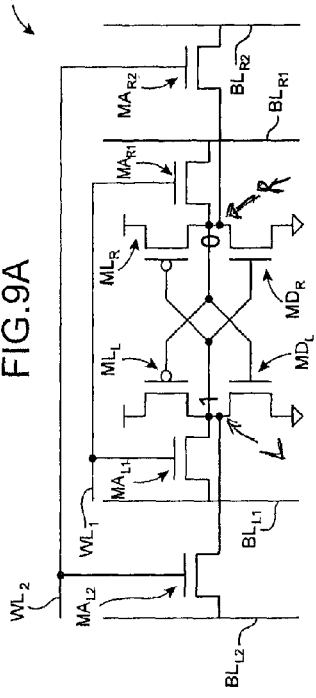
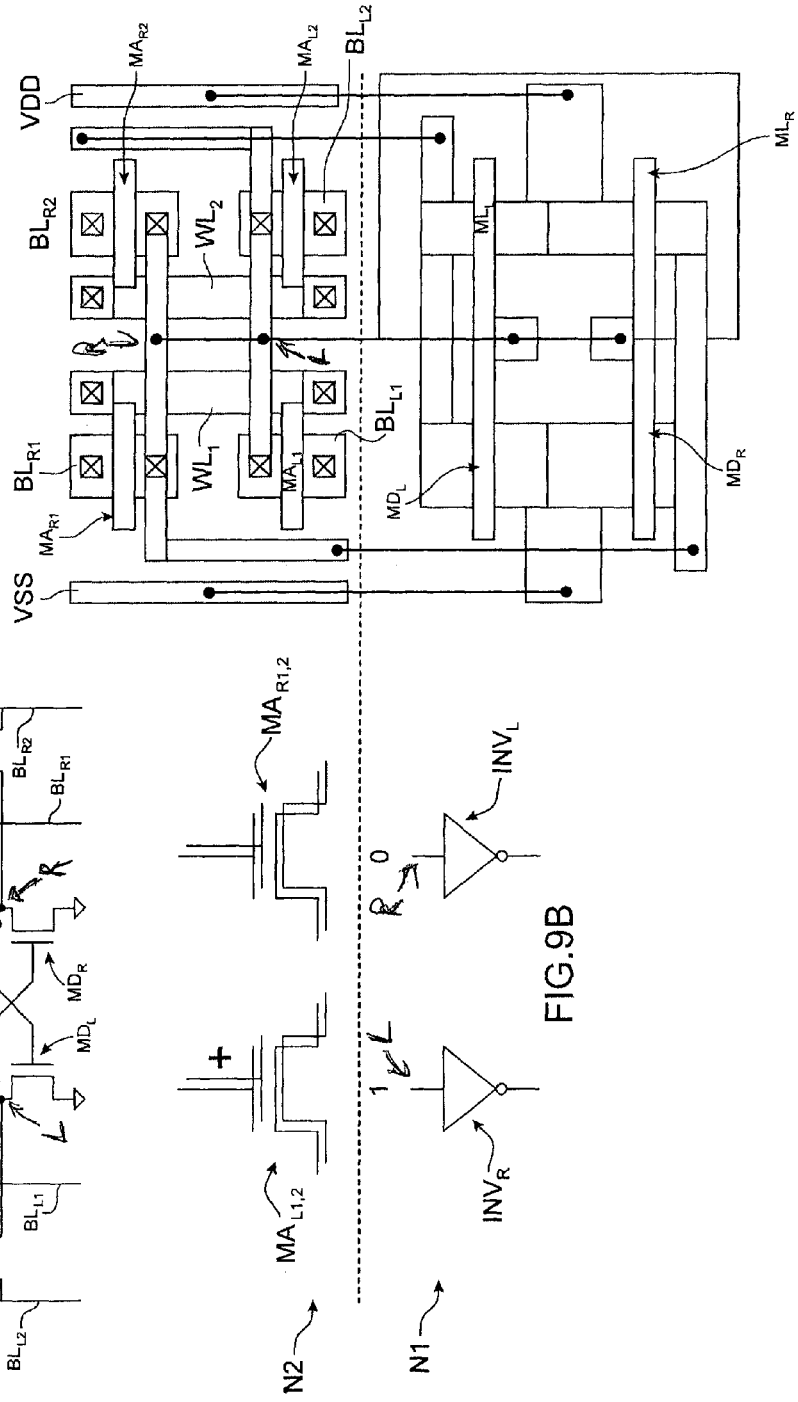
FIG.9A FIG.9B FIG.9C

SRAM MEMORY CELL HAVING TRANSISTORS INTEGRATED AT SEVERAL LEVELS AND THE THRESHOLD VOLTAGE VT OF WHICH IS DYNAMICALLY ADJUSTABLE

TECHNICAL FIELD

This invention relates to the field of memories, and in particular to that of static random access memories SRAM (RAM for "random access memory"). The invention relates in particular to an improved memory cell provided with stacked transistors of which a plurality of transistors have a threshold voltage that can be modulated by coupling with the lower transistor gate.

It introduces advantages particularly in terms of overall dimensions, and the possibility of dynamically modifying the threshold voltage of some of the transistors so as to improve the electrical characteristics thereof, such as stability and consumption.

PRIOR ART

A conventional SRAM memory cell (SRAM for "static random access memory" or static RAM) generally includes two inverters 10, 11, which are connected in a so-called "bistable" or "flip-flop" configuration, and two access transistors 12, 13, which are connected to bit lines 15 and 16 and controlled by a word line 17 (FIG. 1).

The sought-after characteristics of a memory cell are:
- good read stability, which is likewise called SNM (SNM for "Static Noise Margin"),
- a sufficient write margin, which is likewise call WM,
- good retention stability RNM (RNM for "Retention Noise Margin"),
- the strongest conduction current Icell possible, in order to give the cell a high operating speed,
- the smallest cell size possible in order to enable production of a memory with a high cell integration density,
- the weakest retention current Ioff possible so as to minimise the static power consumption.

Since these criteria could not be reconciled, memory developers have been led to make comprises between them.

So-called "4T" SRAM memory cells having four transistors have been developed. The 4T cells have a compact design and enable a high integration density to be obtained. 4T cells have the disadvantage of having a lack of stability in retention mode. This lack of stability can be palliated by a refresh system. The dimensioning of the cells is typically carried out by considering the best compromise which can be achieved between the retention-phase stability and the read-phase stability.

By seeking to increasingly reduce the memory cell transistor sizes, there are fluctuations in the parameters of these transistors, such as the channel width W thereof, the channel length L thereof, the threshold voltage $V_T$ thereof, the permeability $\mu_0$ thereof, the doping Na thereof and the gate oxide thickness Tox thereof. This results in an increase in the sensitivity of the memory cells to various noise sources. The development of a memory cell having a high noise margin therefore increasingly becomes a priority.

The SRAM cells having six transistors, referred to as "6T" cells, offer a good compromise between all of the aforesaid criteria.

For conventional 6T memory cells, the stability of the cells is determined by the static noise margin thereof in read mode (SNM). As a matter of fact, during read access, the gain of the cell inverters tends to be reduced by activating the conduction of the access transistors.

Memory cells having 8 or 9 transistors (8T or 9T) have likewise been produced. Despite a strong improvement in the static noise margin SNM, these cells have considerable overall dimensions in comparison with 6T cells.

Furthermore, SRAM cells produced using partially or completely depleted SOI technology have been produced, wherein the relationship between the static noise margin and the read margin is improved. SRAM cells produced using double-gate or finFET technology have likewise been implemented, wherein the static noise margin was improved. These cells do not enable a high integration density to be achieved.

The problem arises of finding a new SRAM memory cell structure having good retention, read and write stability while still retaining improved overall dimensions.

DISCLOSURE OF THE INVENTION

The invention relates to a static random access memory cell which, on a substrate surmounted by a stack of layers, comprises:
- a first plurality of transistors situated at a given level of the stack of which at least one first access transistor and at least one second access transistor are connected to a word line and are arranged between a first bit line and a first storage node and a second bit line and a second storage node, respectively,
- a second plurality of transistors forming a flip-flop and situated at least one other level of the stack, beneath said given level,
- the transistors of the second plurality of transistors each comprising a gate electrode situated opposite a channel region of a transistor of the second plurality of transistors and separated from this channel region by means of an insulating region provided to enable coupling of said gate electrode and said channel region.

A cell such as this has both improved integration density and electrical performance in comparison with a conventional SRAM memory cell according to the prior art.

According to one possibility, the second plurality of transistors can be formed: from a first conduction transistor and a second conduction transistor, the first conduction transistor having a gate situated opposite the channel region of the first access transistor, the second conduction transistor having a gate situated opposite the channel region of the second access transistor.

According to a second possibility, the second plurality of transistors can be formed: from a first load transistor and from a second load transistor, the first load transistor having a gate situated opposite the channel region of the first access transistor, the second load transistor having a gate situated opposite the channel region of the second access transistor.

According to a third possibility, the second plurality of transistors can be formed: from a first load transistor and a second load transistor, a first conduction transistor, and a second conduction transistor.

The first load transistor and the second load transistor can be arranged opposite the second conduction transistor and the first conduction transistor, respectively.

The first load transistor and the second load transistor, the first conduction transistor and the second conduction transistor can be formed in a single level of said stack.

According to another possibility, the first plurality of transistors can further include: at least one third access transistor and at least one fourth access transistor, which are arranged between a third bit line and the first storage node, and between a fourth bit line and a second storage node, respectively, the third access transistor and the fourth access transistor having a gate connected to a second word line.

The insulating region can have an $SiO_2$ equivalent thickness $e_c$ of between 1 and 50 nanometers, e.g., between 10 and 50 nanometers.

An $SiO_2$ equivalent thickness is understood to mean that the dielectric region contains a dielectric material other than $SiO_2$, of between 1 and 50 nanometers, e.g., between 10 and 50 nanometers.

The coupling may be such that a variation in the potential of said gate electrode results in a variation in the threshold voltage of said channel region.

The coupling may be such that a variation in the potential of said gate electrode of more than Vdd enables obtainment of a variation in the threshold voltage of said channel region of at least 50 mV.

Between said gate and said channel region, said insulating region can be formed from a first region containing a dielectric material having a first dielectric constant $k_1$, which is opposite the source and drain regions, said insulating region being formed from a second region comprising at least one second dielectric material having a second dielectric constant $k_2$ such that $k_2 < k_1$.

The second region can comprise a stacking of said first dielectric material and said second dielectric material.

BRIEF DESCRIPTION OF THE DRAWINGS

This invention will be better understood upon reading the description of embodiments, which are given for purely illustrative, non-limiting purposes, with reference to the appended drawings, in which:

FIGS. 5A-5C show another exemplary 4T SRAM cell according to the invention;

FIGS. 7A-7C show another exemplary SRAM cell according to the invention, with 6 transistors distributed over 3 levels;

FIGS. 8A-8C show another exemplary SRAM cell according to the invention, with 6 transistors distributed over 2 levels;

FIGS. 9a-9C show another exemplary SRAM cell according to the invention, with 6 transistors distributed over 2 levels.

Figure 10A:
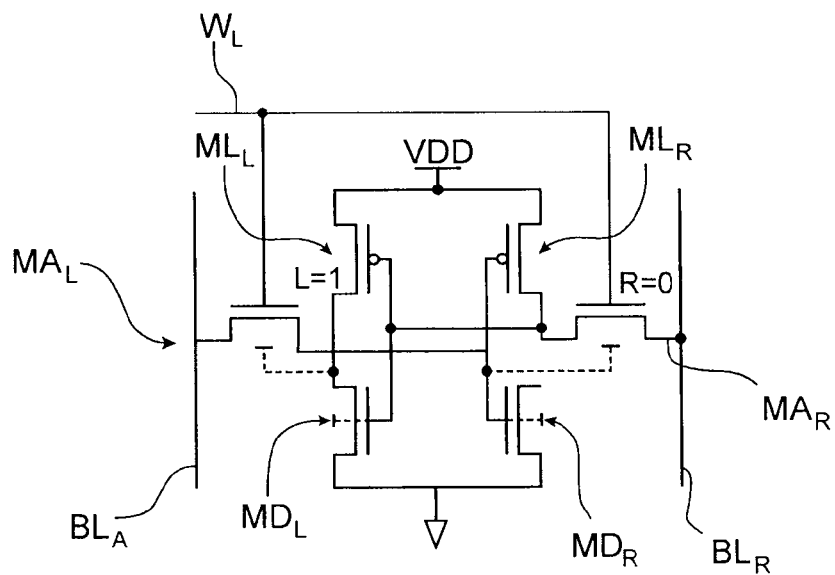
Figure 10B:
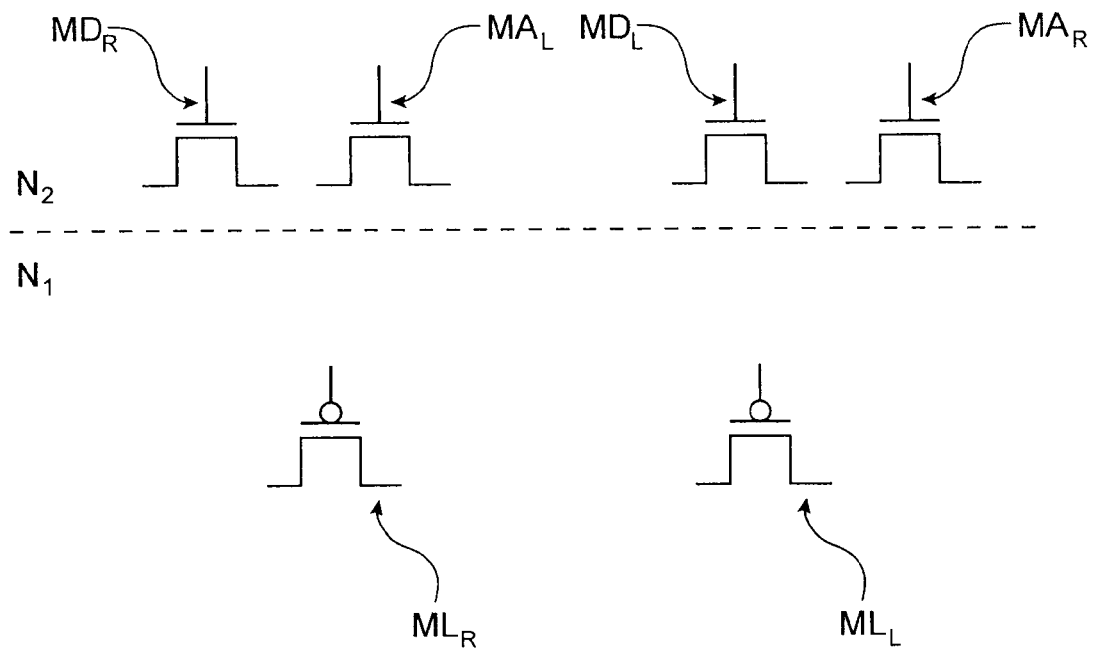

A seventh exemplary random access memory cell 700 according to the invention is shown in FIGS. 10A-10B.

Identical, similar or equivalent portions of the various figures bear the same numeric references so as to facilitate shifting from one figure to another.

The various portions shown in the figures are not necessarily at a uniform scale, in order to render the figures more legible.

DETAILED DISCLOSURE OF PARTICULAR EMBODIMENTS

Figure 1:
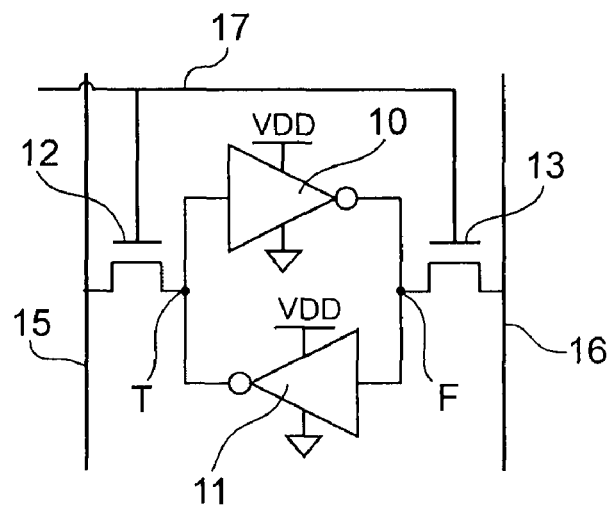
FIG. 1 shows an exemplary SRAM cell according to the prior art.
Figure 2A:
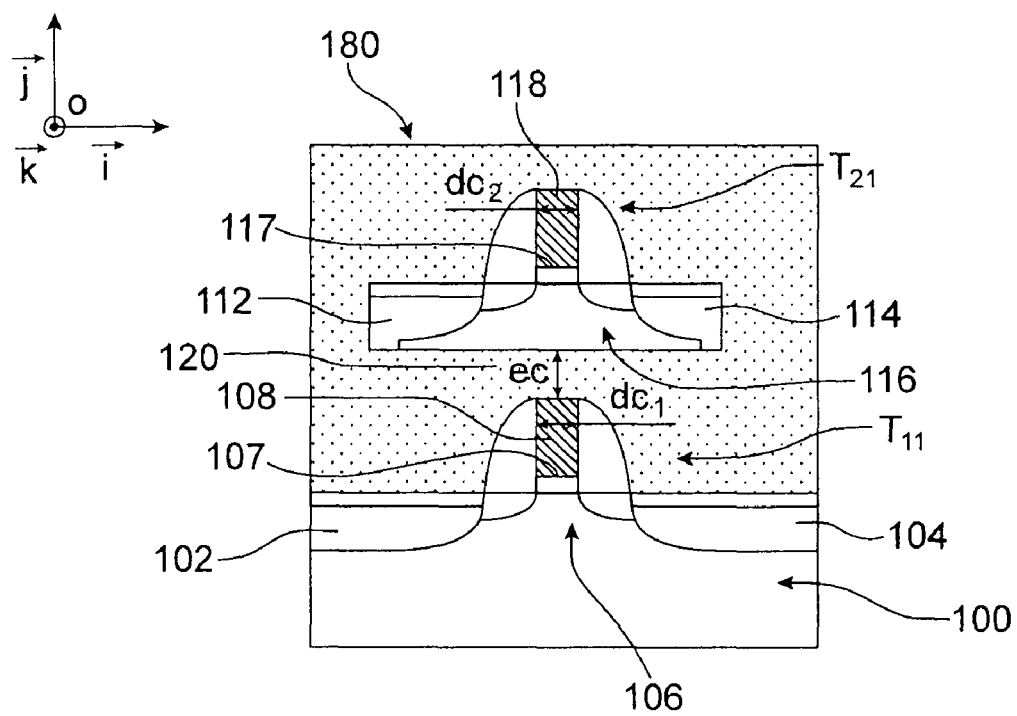
FIGS. 2A-2C show exemplary arrangements of transistors in a SRAM memory cell according to the invention.

A transistor arrangement, as anticipated in a memory cell implemented according to the invention, will now be provided in connection with FIG. 2A.

The transistors are produced on a substrate 100, which can be a bulk or semiconductor-on-insulator type substrate, e.g., of the SOI (silicon-on-insulator) type, comprising a first support layer which can be semi-conducting and, for example, containing Si, which is coated with an insulating layer, e.g., containing $SiO_2$, which is itself coated with a semiconductor layer, e.g., containing Si, and in which one or more active regions are capable of being formed.

A stack of layers rests on the substrate 100, in which a first transistor $T_{11}$ appears, comprising a source region 102, a drain region 104, as well as a channel region 106 connecting the source region 102 and the drain region 104. The first transistor $T_{11}$ may optionally be formed on a completely depleted or partially depleted SOI substrate.

The transistor $T_{11}$ likewise comprises a gate 108 situated on a layer of dielectric 107 gate 108 material.

The dielectric material 107 can have an equivalent $SiO_2$ thickness, which is also called an EOT thickness (for "Equivalent Oxide Thickness") of between 1 and 50 nm. The dielectric material 107, for example, can be $SiO_2$ or a material of the type commonly referred to as "high-k", such as $HfO_2$.

The gate 108 of the first transistor $T_{11}$ can have a critical dimension $dc_1$, for example, of between 10 and 100 nanometers (the critical dimension $dc_1$ being measured in a direction parallel to that of the vector $\vec{i}$ of an orthogonal reference [0; $\vec{i}$; $\vec{j}$; $\vec{k}$] provided in FIG. 5). Throughout this description, the term "critical dimension" is understood to mean the smallest dimension of a pattern excluding the thickness thereof.

The gate of the first transistor $T_{11}$ can likewise have a thickness, for example, of between 10 and 100 nanometers (the thickness of the gate being measured in a direction parallel to that of the vector $\vec{j}$ of an orthogonal reference [0; $\vec{i}$; $\vec{j}$; $\vec{k}$] provided in FIG. 5).

The gate 108 of the first transistor $T_{11}$, for example, can contain a doped semiconductor material, such as polysilicon or a metal, e.g., such as TiN.

The device likewise comprises at least one second transistor $T_{21}$ formed above the first transistor $T_{11}$, in a level of the stack higher than that of the level in which the first transistor $T_{11}$ is situated.

The second transistor $T_{21}$ comprises a source region 112, a drain region 114, as well as a channel structure 116 connecting the source region 112 and the drain region 114. The second transistor $T_{21}$ likewise comprises a gate 118 resting on a dielectric 117 gate layer.

The gate dielectric 117 can have a thickness, for example, of between 0.5 and 4 nanometers. The gate dielectric, for example, can be $SiO_2$ or a material of the type commonly referred to as "high-k", such as $HfO_2$.

The gate 118 of the second transistor $T_{21}$ can have a critical dimension $dc_2$, for example, of between 10 and 100 nanometers ($dc_2$ being measured in a direction parallel to that of the vector $\vec{i}$ of the orthogonal reference [0; $\vec{i}$; $\vec{j}$; $\vec{k}$]). The gate of the second transistor $T_{21}$ can likewise have a thickness of between 10 and 100 nanometers. The gate of the second transistor $T_{21}$, for example, can contain a semiconductor material such as polysilicon or a metal, e.g., such as TiN.

The gate 118 of the first transistor $T_{11}$ and the channel region of the second transistor $T_{21}$ are spaced apart by a distance or a thickness $e_c$, which is chosen or predetermined. The gate 108 of the first transistor $T_{11}$ and the channel region of the second transistor $T_{21}$ are separated by an insulating region 120 formed by an ILD ("inter-layer dielectric) layer of small thickness.

The insulating region, for example, can contain $SiO_2$ or a dielectric material commonly referred to as "high-k", such as $HfO_2$.

The insulating region 120 is implemented so as to enable coupling between the gate 108 of the first transistor $T_{11}$ and the channel of the second transistor $T_{21}$, which is situated above and opposite the gate 108 of the first transistor $T_{11}$.

Preferably, the thickness of this insulating region $e_c$ is chosen, in particular, to be much smaller than that of the thicknesses of the layers of inter-layer dielectric materials in the devices according to the prior art, and which, in these devices, is provided for so as to enable various stacked layers of components or interconnecting lines to be insulated therebetween.

A "small" thickness $e_c$ or distance $e_c$ is understood to mean that $e_c$ can be between 1 and 50 nanometers of $SiO_2$ equivalent thickness, in order to enable the coupling.

In addition to the thickness, the nature of the dielectric material of the insulating region, e.g., of $SiO_2$ or $HfO_2$, is likewise chosen to enable obtainment of a coupling between the lower-level transistor gate and the channel region of the level transistor.

The $SiO_2$ equivalent thickness EOT of a "high-k" dielectric of thickness $T_{high-k}$ is obtained by the following relationship:

$$EOT = \frac{\varepsilon_{SiO2}}{\varepsilon_{high-k}} \cdot T_{high-k}$$

With a device such as this, the threshold voltage $V_T$ of the second transistor $T_{21}$ channel can be adjusted based on the manner in which the biasing of the gate 108 of the first transistor $T_{11}$ is provided. In order to vary the threshold voltage $V_T$ of the second transistor $T_{21}$ channel using such a device, the potential applied to the gate 108 of the lower-level transistor $T_{11}$ can be varied.

The gate of the first transistor $T_{11}$ thus makes it possible to control the potential of the channel of the upper-level transistor $T_{21}$.

The first transistor $T_{11}$ and the second transistor $T_{21}$ are arranged such that the gate 108 of the first transistor $T_{11}$ is situated opposite the semiconductor region 116 of the second transistor $T_{21}$ channel. In this example, the gates 108 and 118 have patterns which are aligned in a direction orthogonal to the principle plane of the substrate (in a direction parallel to that of the vector $\vec{j}$ of orthogonal reference $[0; \vec{i}; \vec{j}; \vec{k}]$).

Preferably, in order to obtain improved control over the potential of the second transistor $T_{21}$ channel, the entire upper or top face of the gate 108 of the first transistor $T_{11}$ is arranged opposite the semiconductor region 116 of the second transistor $T_{21}$ channel.

The channel region 116 of the second transistor $T_{21}$ can be made in a semiconductor layer of small thickness, so as to enable static control at the inversion channel level. The term small thickness is understood to mean that the channel region 116 of the second transistor $T_{21}$ can be formed in a semiconductor layer having a thickness, for example, of between 1 and 100 nm, or, for example, of between 5 and 20 nanometers.

The thickness chosen for the semiconductor layer in which channel 116 is made is provided, in particular, on the basis of the level of doping of this layer, in order to enable a completely depleted behaviour.

The channel regions of transistors $T_{11}$ and $T_{21}$ can be formed, for example, in Si or in another semiconductor material, e.g., such as Ge.

The insulating region separating the gate of transistor $T_{11}$ from the semiconductor layer on which transistor $T_{21}$ is made is provided in order to enable significant coupling of the gate with the substrate. The term significant coupling is understood to mean coupling which enables the threshold voltage of the upper-level transistor $T_{21}$ to be varied by at least 50 mV, for a variation in the voltage applied to the gate of the lower-level transistor $T_{11}$ of between 0 and Vdd or −Vdd and +Vdd, depending on the application, with Vdd being the supply voltage for the device. Vdd Voltage, for example, can be of the order of 1 Volt or 0.5 V.

A model such as the one described in the article by Lim and Fossum: IEEE Transactions on electron devices, vol. ED-30, No. 10, October 1983, can be used for dimensioning the insulating region 120, so as to obtain a desired variation in the threshold voltage $\Delta Vth$ when the biasing voltage of the gate 108 of the first transistor $T_{11}$ is varied by $\Delta V$.

A model such as this can be used, in particular, in the case where the second transistor $T_{21}$ is made on a completely depleted layer.

$$\Delta V_{th} = \frac{\frac{\varepsilon_{sc}}{T_{sc}} \cdot \frac{\varepsilon_{ILD}}{T_{ILD}}}{\frac{\varepsilon_{ox}}{T_{ox}} \cdot \left(\frac{\varepsilon_{sc}}{T_{sc}} + \frac{\varepsilon_{ILD}}{T_{ILD}}\right)} \cdot \Delta V$$

With:

$\Delta Vth$ being the variation in the threshold voltage of the second transistor $T_{21}$, $\varepsilon_{sc}$, $T_{sc}$, being the dielectric permittivity and the thickness of the semiconductor layer in which the channel 116 of transistor $T_{21}$ is made, respectively, $\varepsilon_{ox}$, $T_{ox}$, being the dielectric permittivity and the thickness of the gate of the second transistor $T_{21}$, respectively, $\varepsilon_{ILD}$, $T_{ILD}$ being the dielectric permittivity and the thickness of the dielectric of the insulating region 120 separating the semiconductor layer of the second transistor $T_{21}$ from the gate 108 of the first transistor $T_{11}$.

Thus, when the potential of the gate of the first lower transistor $T_{11}$ varies by 0 to Vdd:

$$\Delta V_{th} = \frac{\frac{\varepsilon_{sc}}{T_{sc}} \cdot \frac{\varepsilon_{ILD}}{T_{ILD}}}{\frac{\varepsilon_{ox}}{T_{ox}} \cdot \left(\frac{\varepsilon_{sc}}{T_{sc}} + \frac{\varepsilon_{ILD}}{T_{ILD}}\right)} \cdot V_{DD} \quad (1)$$

In order to achieve a significant degree of coupling corresponding to a threshold voltage variation $\Delta Vth=50$ mV, in the case wherein the gates 108 and 118 have a critical dimension of the order of 45 nm, wherein the thickness $T_{sc}$ of the channel region 116 is equal to 7 nm, wherein the latter is made of silicon, wherein the thickness $T_{ox}$ of the dielectric region 117 is equal to 1 nm, wherein the latter contains $SiO_2$, wherein Vdd=1V, and wherein region 120 is made of $SiO_2$, the insulating region 120, for example, is provided with a thickness, for example, of the order of 17.5 nm.

For example, in order to achieve an identical coupling with an insulating region separating the $HfO_2$-based stacked transistors with a permittivity of 20, the physical thickness of the "high-k" layer is of the order of 90.5 nm.

In the case where the dielectric of the insulating region 120 contains a "high-k" material, the thickness $T_{high-k}$ to be provided for this insulating layer 120 is determined by the preceding formula, by replacing $T_{ox}$ with:

$$Tox = \frac{\varepsilon_{SiO2}}{\varepsilon_{high-k}} \cdot T_{high-k}$$

The first transistor $T_{11}$ and the second transistor $T_{21}$ are transistors of a memory cell, in particular an SRAM memory cell.

A dynamic modification of the threshold voltage $V_T$ of the second transistor can be obtained by the use of means (not shown) for applying a variable potential, which are provided for:

applying a first potential to the gate of the first transistor, during one phase, applying another potential to the gate of the first transistor during another phase.

An example of a microelectronic device with two transistors has just been described. However, a device according to the invention can include a higher number of transistors, e.g., a number n (with n being an integer such that n>2) of stacked transistors $T_{11}$, $T_{21}$, $T_{(n-1)1}$, $T_{n1}$, each transistor $T_k$ of a given level $N_k$ (with k being an integer such that $1<k<n$) comprising a channel region capable of being coupled to the gate electrode of a transistor $T_{k-1}$ of a level $N_{k-1}$ lower than the given level $N_k$, this gate being situated opposite said channel region, at a distance sufficiently small to enable such coupling.

Figure 2B:
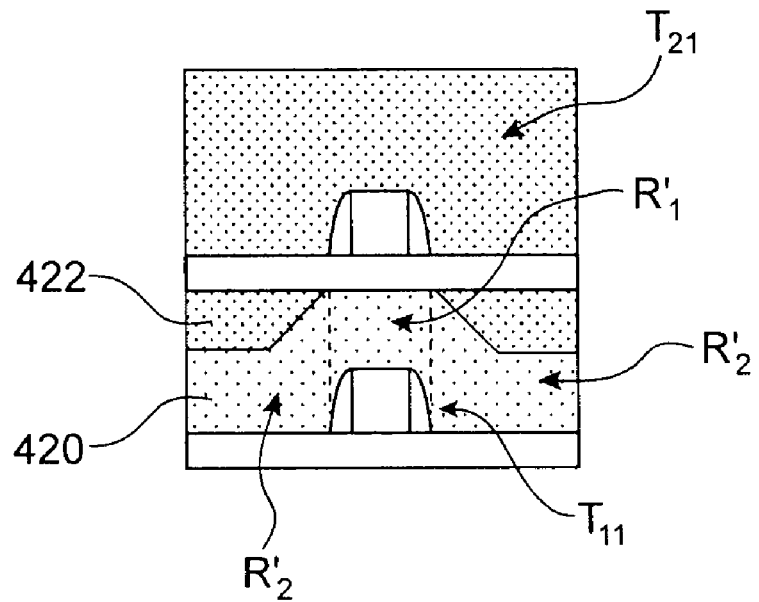

Another example of a microelectronic device implemented according to the invention is shown in FIG. 2B.

This device differs from the one previously described in connection with FIG. 2B in that, between transistors $T_{11}$ and $T_{21}$, it comprises an insulating region comprising several different dielectric materials, the thickness and the distribution of said dielectric materials being provided so as to enable a coupling in a first region $R_1$ situated between the gate of the first transistor $T_{11}$ and the channel of the second transistor $T_{21}$, and to prevent coupling between transistors $T_{11}$ and $T_{21}$ in a region $R_2$ situated around this first region $R_1$.

To accomplish this, the gate 108 of the first transistor $T_{11}$ and the channel 116 of the second transistor $T_{21}$ are separated by a first dielectric material 420 having a first dielectric constant $k_1$.

Insulating regions formed from a second dielectric material 422 having a second dielectric constant $k_2$, such that $k_2<k_1$, are formed around this first region $R_1$, above the source and drain regions of the first transistor $T_{11}$.

The first region $R_1$ can be filled with a "high-k" dielectric material, e.g., such as $HfO_2$, while the region situated around this first region can be filled with a dielectric material having a lower dielectric constant, such as $SiO_2$.

With a device such as this, the threshold voltage $V_T$ of the channel of the second transistor $T_{21}$ can be adjusted, based on the manner in which the biasing of the gate 108 of the first transistor $T_{11}$ is provided. The gate of the first transistor $T_{11}$ thereby makes it possible to control the channel potential of the higher-level transistor $T_{21}$. However, the coupling phenomena between the second transistor $T_{21}$ and the first transistor $T_{11}$ are prevented in the regions situated outside the channel of the second transistor.

Figure 2C:
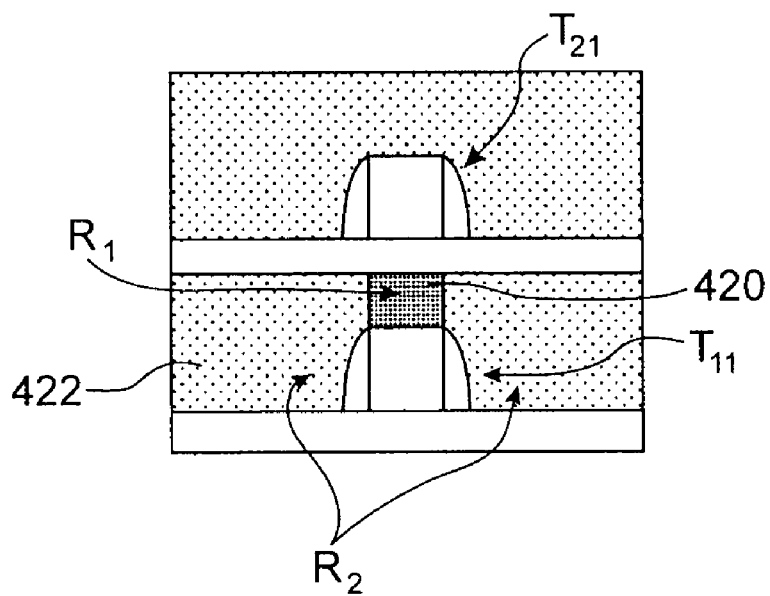

Another example of a microelectronic device implemented according to the invention is shown in FIG. 2C. As in the previously described example in connection with FIG. 2A, this device comprises an insulating region separating transistors $T_{11}$ and $T_{21}$, with several different dielectric materials.

The gate 108 of the first transistor $T_{11}$ and the channel region 116 of the second transistor $T_{21}$ are separated by a first region R'1 containing a first dielectric material 420, e.g., a dielectric material having a first dielectric constant $k_1$. Around this first region R'1, in a region R'2 situated above the source and drain regions of the first transistor $T_{11}$, insulating regions appear, which are formed by a stacking of the first dielectric material 420 and a second dielectric material 422 having a second dielectric constant $k_2$, such that $k_2<k_1$.

The first transistor $T_{11}$ and the second transistor $T_{21}$ are transistors of a memory cell, in particular an SRAM memory cell, e.g., an SRAM cell with four transistors (4T) or an SRAM cell with 6 transistors (6T).

Figure 3A:
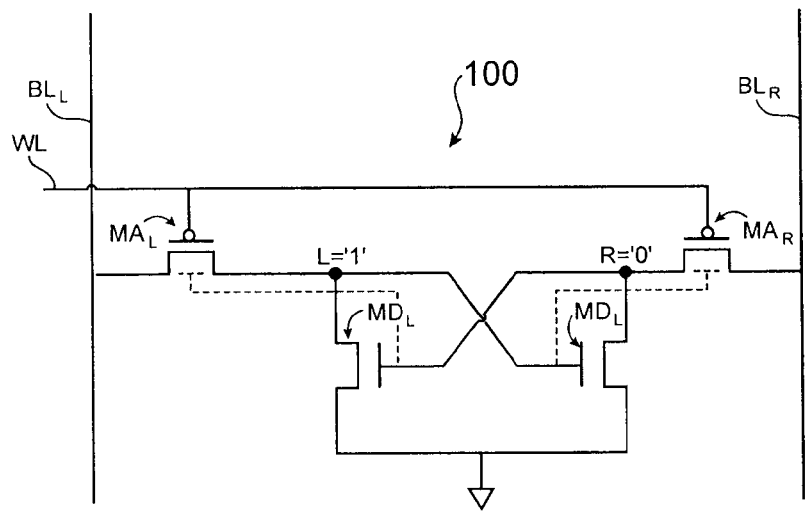
FIGS. 3A-3C show a first exemplary 4T SRAM memory cell according to the invention.
Figure 3B:
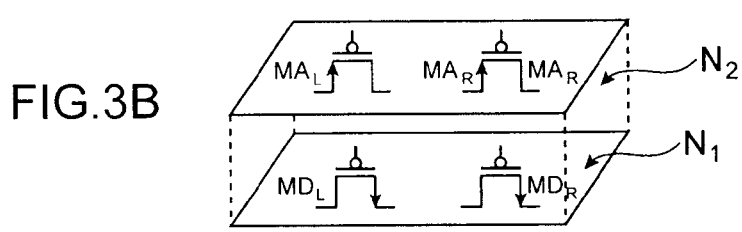
Figure 3C:
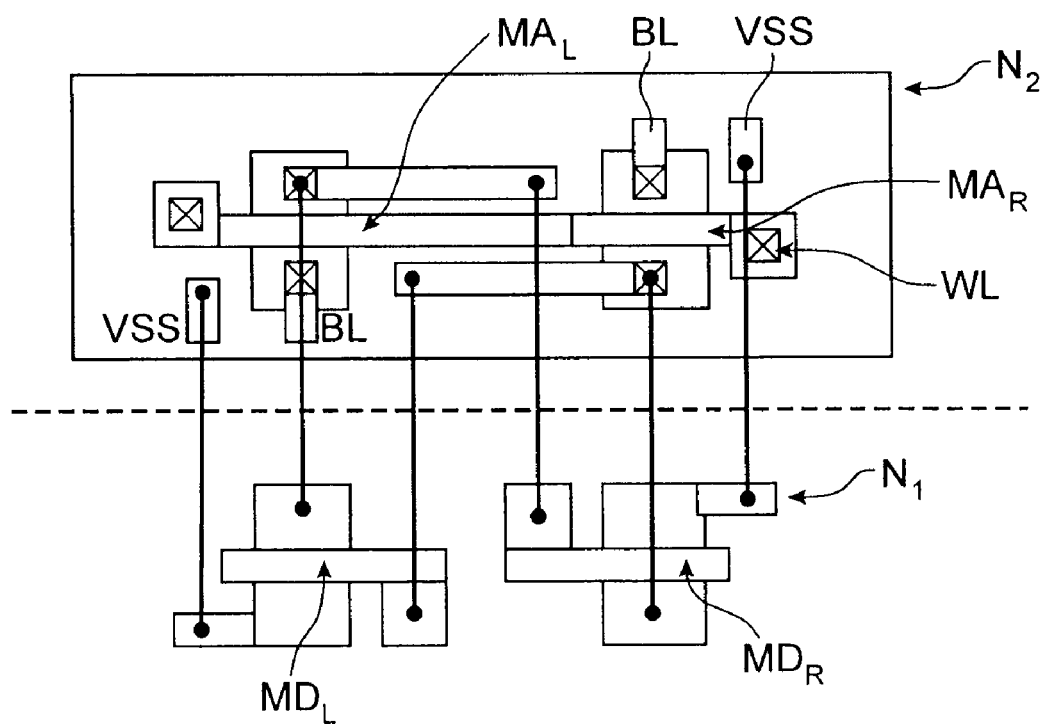

A first exemplary random access memory cell 100 according to the invention is shown in FIGS. 3A to 3C.

This memory cell 100 is a 4T-type SRAM static memory cell, i.e., equipped with 4 transistors. The cell 100 includes a plurality of transistors forming a first inverter and a second inverter, which are connected in a bistable configuration commonly referred to as "flip-flop".

In this example, the flip-flop is formed by a first conduction transistor $MD_L$, of the NMOS type, for example. The gate of the second conduction transistor $MD_R$ is connected to a first storage node L of the cell 100, while the gate of the first conduction transistor $MD_L$ is connected to a second storage node R of the cell 100. The sources of the conduction transistors $MD_L$, $MD_R$, are connected to one another and to a ground potential Vss, while the drain of the first conduction transistor $MD_L$ is connected to the first node L and the drain of the second conduction transistor $MD_R$ is connected to the second node R. The conduction transistors $MD_L$, $MD_R$ are provided for maintaining a load required for the establishment of a given logic level, e.g., '0', corresponding, for example, to a potential equal to potential Vss, on one of nodes L or R, based on the logic value stored in cell 100.

Cell 100 is likewise equipped with a first access transistor $MA_L$ and a second access transistor $MA_R$. The access transistors $MA_L$ and $MA_R$ comprise a gate connected to a word line WL. The source of the first access transistor $MA_L$ is connected to a first bit line $BL_L$, while the source of the second access transistor $MA_R$ is connected to a second bit line $BL_R$. The drain of the first access transistor $MA_L$ is connected to the first storage node L, while the drain of the second access transistor $MA_R$ is connected to the second storage node R. The access transistors $MA_L$, $MA_R$ are arranged to enable access to the storage nodes L and R, during a read or write phase of the cell 100, and to block access to the cell 100 when the cell 100 is in an information retention mode.

In a cell such as this, transistors $MD_L$ and $MA_L$ have a similar arrangement to that of the first transistor $T_{11}$ and the second transistor $T_{21}$, respectively, of the example described previously in connection with FIGS. 2A-2C. Transistors $MD_L$, $MA_L$ are, as a matter of fact, stacked, and arranged such that the channel region of the first access transistor $MA_L$ is situated above and opposite the gate of the first conduction transistor $MD_L$, at a distance provided for so as to enable coupling between the gate of conduction transistor $MD_L$ and the channel of access transistor $MA_L$ (a coupling such as this being diagrammed in FIG. 3A by a broken line between conduction transistor $MD_L$ and access transistor $MA_L$). Access transistor $MA_L$ and the first conduction transistor $MD_L$ are separated by an insulating region having a thickness and composition provided for so as to enable a coupling such as this.

By reason of an arrangement such as this, the threshold voltage of the first access transistor $MA_L$ depends on the biasing of the gate of the first conduction transistor $MD_L$.

In a cell such as this, transistors $MD_R$ and $MA_R$ likewise have an arrangement similar to that of the first transistor $T_{11}$ and the second transistor $T_{21}$, respectively, of the exemplary device described previously in connection with FIGS. 2A-2C.

Transistors $MD_R$, $MA_R$ are likewise stacked and arranged such that the channel region of the second access transistor $MA_R$ is situated above and opposite the gate of the second conduction transistor, at a distance provided for so as to enable coupling between the gate of the second conduction transistor $MD_R$ and the channel of the second access transistor $MA_R$.

Access transistor $MA_R$ and conduction transistor $MD_R$ are separated by an insulating region having a thickness and composition provided for so as to enable coupling.

By reason of an arrangement such as this, the threshold voltage of the second access transistor $MA_R$ depends on the biasing of the gate of the second conduction transistor $MD_L$.

Transistors $MD_L$, $MD_R$, $MA_L$, $MA_R$ are formed in a stack of thin layers, the conduction transistors $MD_L$ and $MD_R$ being situated in a single first level N1 of the stack, while the access transistors $MA_L$ and $MA_R$ are situated above the conduction transistors $MD_L$ and $MD_R$, in a single second level N2 of the stack (FIGS. 3B and 3C).

The access transistors $MA_L$, $MA_R$ thus have a threshold voltage that can be modulated on the basis of the respective potential of the gates of the conduction transistors $MD_L$, $MD_R$.

Figure 4:
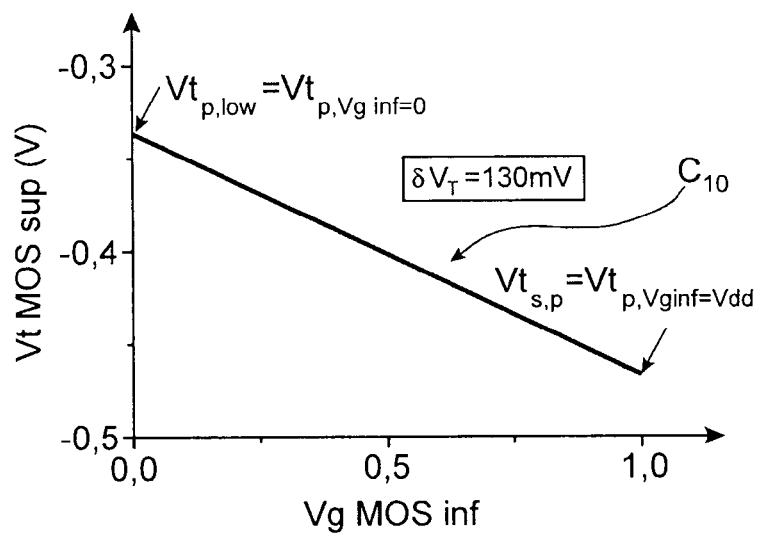
FIG. 4 provides a threshold voltage behaviour curve for transistors in the first exemplary 4T SRAM memory cell according to the invention.

With a PMOS-type access transistor above an NMOS-type conduction transistor, as described previously, the threshold voltage of the access transistor can vary by a reference value written as Vt s, p, when the gate of the conduction transistor is biased with a supply potential Vdd equal to 1 V, for example, with a low value written as Vtp, low, when the gate of the lower conduction transistor is biased at 0 V (curve $C_{10}$ of FIG. 4A).

One operating mode of the cell 100 is as follows:

In retention mode, the bit lines $BL_L$, $BL_R$, are placed at a potential Vdd, while the word line WL is likewise maintained at the supply potential Vdd, in order to stabilise the stored data. The access transistors $MA_L$ and $MA_R$ are then in a blocked state. In the case wherein the first node L is at a high logic level, e.g., at potential Vdd, and wherein the second node R is at a low logic level, e.g., at 0 V, the first conduction transistor $MD_L$ is likewise blocked, while the second conduction transistor $MD_R$ is conductive. In order to maintain the potential of the first node L close to Vdd, an $I_{MAL-OFF}$ current is provided, which passes through the first access transistor $MA_L$, and which is higher than the $I_{MDL-OFF}$ current, which passes through the first conduction transistor $MD_R$ associated with the gate current coming from $ML_L$ ($I_{MLL-G}$):

$$I_{MAL-OFF} > I_{MDL-OFF} + I_{MDR-G}$$

In this example, due to the configuration of cell 100, the first access transistor $MA_L$ has a low threshold voltage $V_T$, which is capable of increasing the $I_{MAL-OFF}$ current, thereby making it possible to ensure a good retention noise margin (RNM).

In read mode, the word line WL is biased at VSS, in order to access the data stored in the storage nodes L, R via the bit lines $BL_L$ and $BL_R$. The access transistors $MA_L$ and $MA_R$ are then in a conductive state. In the case wherein the first node L is at a high logic level, e.g., at potential Vdd, and wherein the second node R is at a low logic level, e.g., at 0 V, the first conduction transistor $MD_L$ is likewise blocked, while the second conduction transistor $MD_R$ is conductive. In order to maintain the potential of the second node R close to 0, an $I_{MAR-ON}$ current is provided, which passes through the second access transistor $MA_R$, and which is lower than the $I_{MDR-ON}$ current, which passes through the second conduction transistor $MD_R$:

$$I_{MAR-ON} < I_{MDR-ON}$$

In this example, due to the configuration of cell 100, the second access transistor MAR has a reference threshold voltage close to the threshold voltage of transistor MDR, thereby making it possible to obtain a good read noise margin (SNM).

Cell 100 can then have an SNM of the order of 150 mV and an RNM of the order of 320 mV.

By increasing the width of the conduction transistors, the compromise between SNM and RNM can be improved (reduction in the RNM and increase in the SNM).

Cell 100 likewise introduces an improvement in terms of a compromise between read stability and retention stability, in comparison with a 4T cell according to the prior art.

A cell configuration such as this can likewise make it possible to do without a refresh device.

By placing the access transistors above the conduction transistors, the integration density is likewise increased in comparison with a 4T memory cell according to the prior art. A reduction in the occupied surface area of the order of 16.4% in comparison with a cell according to the prior art can be obtained.

A second exemplary random access memory cell 200 according to the invention is shown in FIGS. 5A-5C.

This memory cell 200 is an alternative of the previously described 4T memory cell. Cell 200 includes a plurality of transistors forming a first inverter and a second inverter, which are connected together in a flip-flop configuration.

In this example, the flip-flop is formed by a first load transistor $ML_L$ and a second load transistor $ML_R$, of the PMOS type, for example. The sources of the load transistors $ML_L$, $ML_R$ are connected to a supply potential Vdd, while the drain of the first load transistor $ML_L$ is connected to the first node L and the drain of the second load transistor $ML_R$ is connected to the second node R.

Cell 200 is likewise equipped with a first access transistor $MA_L$ and a second access transistor $MA_R$, of the NMOS type, for example. The access transistors $MA_L$, $MA_R$ are arranged to enable access to the storage nodes L and R, during a read or write phase of the cell 200, and to block access to the cell 200, when the cell 200 is in an information retention mode.

In a cell 200 such as this, transistors $ML_L$ and $MA_L$ have an arrangement similar to that of the first transistor T11 and the second transistor T21, respectively, of the exemplary device described previously in connection with FIGS. 2B-2C. Transistors $ML_L$, $MA_L$ are stacked and arranged such that the channel region of the first access transistor $MA_L$ is situated above and opposite the gate of the first load transistor $ML_L$, at a distance provided for so as to enable coupling between the gate of load transistor $ML_L$ and the channel of access transistor $MA_L$.

Due to an arrangement such as this, the threshold voltage of the first access transistor $MA_L$ is dependent on the bias voltage of the gate of the first load transistor $ML_L$.

In a cell such as this, transistors $ML_R$ and $MA_R$ also have an arrangement similar to that of the first transistor $T_{11}$ and the second transistor $T_{21}$, respectively, of the exemplary device described previously in connection with FIGS. 2B-2C.

The channel region of the second access transistor $MA_R$ is coupled with the gate of the second load transistor $ML_L$.

The threshold voltage of the second access transistor $MA_R$ thus depends on the manner in which the gate of the second load transistor $ML_R$ is biased.

As shown in FIGS. 5B and 5C, the transistors $ML_L$, $ML_R$, $MA_L$, $MA_R$ in the memory cell 200 are formed as a stack of layers, and are arranged such that the load transistors $ML_L$ and $ML_R$ are situated in a single first level $N_1$ of the stack, while the access transistors $MA_L$ and $MA_R$ are situated above the conduction transistors, in a single second level $N_2$ of the stack.

One mode of operation of the cell 200 is as follows:

In retention mode, the bit lines $BL_L$, $BL_R$, are placed at a potential 0, while the word line WL is likewise maintained at the ground potential VSS, so as to stabilise the stored data. The access transistors $MA_L$ et $MA_R$ are then in a blocked state. In the case wherein the first node L is at a high logic level, e.g., at potential Vdd, and wherein the second node R is at a low logic level, e.g., at 0 V, the second load transistor $ML_R$ is likewise blocked, while the first load transistor $ML_L$ is conductive. In order to maintain the potential of the second node R close to 0 V, an $I_{MAR\text{-}OFF}$ current is provided, which passes through the second access transistor $MA_R$, and which is higher than the $I_{MLR\text{-}OFF}$ current, which passes through the second load transistor $ML_R$ associated with the gate current coming from $ML_L$ ($I_{MLL\text{-}G}$):

$$I_{MAR\text{-}OFF} > I_{MLR\text{-}OFF} + I_{MLL\text{-}G}$$

In this example, due to the configuration of cell 200, the second access transistor $MA_R$ has a low threshold voltage $V_T$, which increases $I_{MAR\text{-}OFF}$ and intrinsically ensures a good retention noise margin (RNM).

In read mode, the word line WL is biased at a potential VDD, in order to access the data stored in the storage nodes L, R, via the bit lines $BL_L$ and $BL_R$. The access transistors $MA_L$ and $MA_R$ are then in a conductive state. In the case wherein the first node L is at a high logic level, e.g., at potential Vdd, and wherein the second node R is at a low logic level, e.g., at 0 V, the first load transistor $ML_L$ is likewise conductive, while the second load transistor $ML_R$ is blocked. In order to maintain the potential of the second node L close to VDD, an $I_{MAL\text{-}ON}$ current is provided, which passes through the first access transistor $MA_L$, and which is lower than the $I_{MLL\text{-}ON}$ current, which passes through the first load transistor $ML_L$:

$$I_{MAL\text{-}ON} < I_{MLL\text{-}ON}$$

In this example, due to the configuration of cell 200, $MA_L$ has a reference threshold voltage close to the threshold voltage of the second conduction transistor $MD_R$, thereby making it possible to obtain a good read noise margin (SNM).

A cell 200 such as this likewise has an improved read margin, as well as a better compromise between the read margin and retention margin than does a conventional 4T cell.

By placing the access transistors above the conduction transistors, the integration density is likewise increased, in comparison with a 4T memory cell according to the prior art.

Figure 6C:
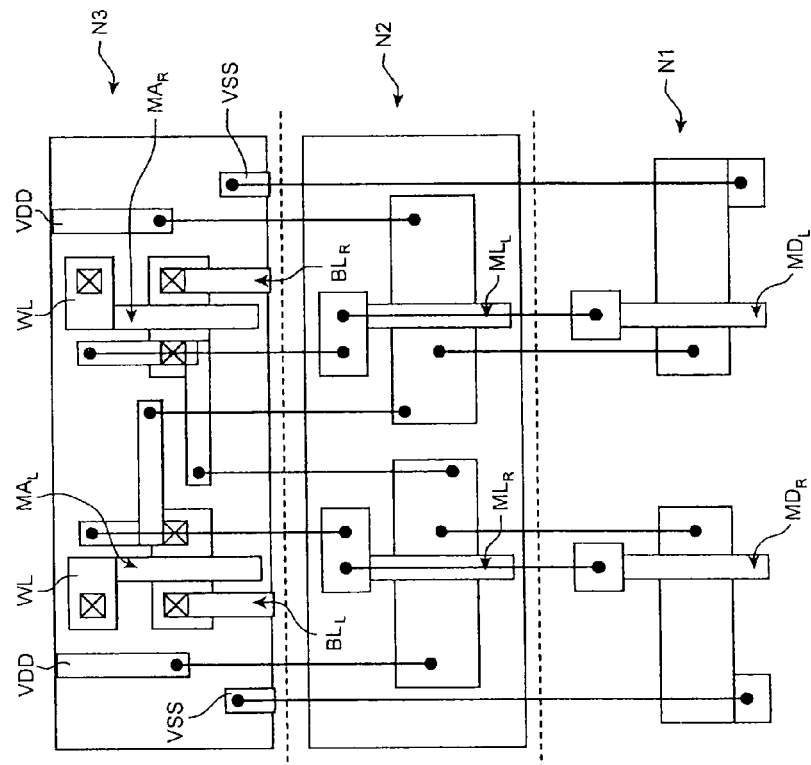
FIGS. 6A-6C show an exemplary SRAM cell according to the invention, with 6 transistors distributed over 3 levels.
Figure 6A:
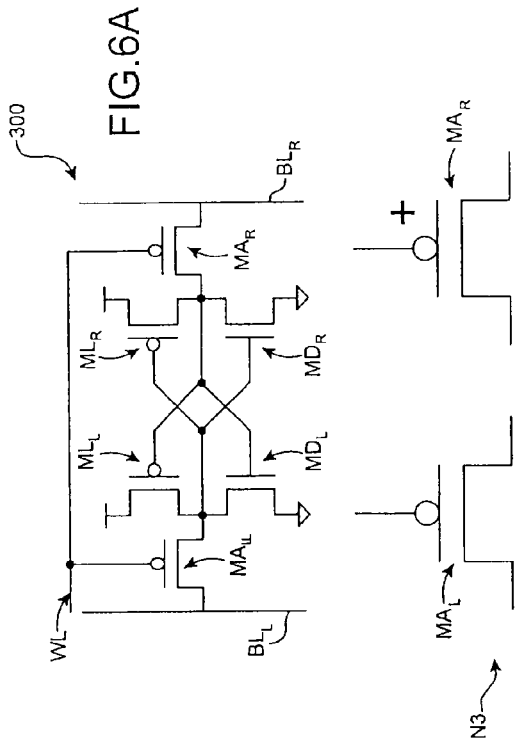
Figure 6B:
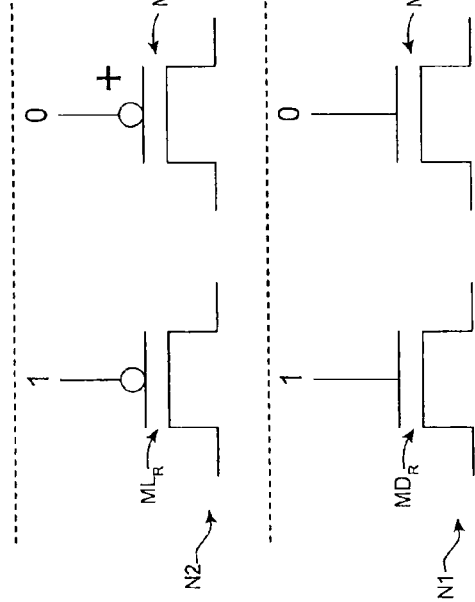

A third exemplary random access memory cell 300 according to the invention is shown in FIGS. 6A-6C.

This cell 300 includes a plurality of transistors forming a first inverter and a second inverter, which are connected together in a flip-flop configuration. In this example, the flip-flop is formed by a first conduction transistor $MD_L$ and a second conduction transistor $MD_R$, of the NMOS type, for example, as well as by a first load transistor $ML_L$ and a second load transistor $ML_R$, of the PMOS type, for example.

The gate of the second conduction transistor $MD_R$ is connected to the first storage node L of cell 300, while the gate of the first conduction transistor $MD_L$ is connected to the second storage node R of cell 300.

The sources of the conduction transistors $MD_L$, $MD_R$ are each connected to a ground potential Vss, while the drain of the first conduction transistor $MD_L$ is connected to the first storage node L and the drain of the second conduction transistor $MD_R$ is connected to the second node R.

The sources of the load transistors $ML_L$, $ML_R$ are each connected to a supply potential Vdd, while the drain of the first load transistor $ML_L$ is connected to the first node L and the drain of the second load transistor $ML_R$ is connected to the second node R.

Cell 300 is likewise equipped with a first access transistor $MA_L$ and a second access transistor $MA_R$.

In a cell such as this, transistors $MD_R$ and $ML_R$ also have an arrangement similar to that of the first transistor $T_{11}$ and the second transistor $T_{21}$, respectively, of the exemplary device described previously in connection with FIGS. 2B-2C.

Thus, transistors $MD_R$, $ML_R$ are arranged such that the channel region of the second load transistor $ML_R$ is situated above and opposite the gate of the second conduction transistor $MD_R$, and are separated by an insulating thickness provided to enable coupling between this gate and this channel.

Transistors $ML_L$ and $MD_L$ likewise have an arrangement similar to that of the first transistor $T_{11}$ and the second transistor $T_{21}$, respectively, of the exemplary device described previously in connection with FIGS. 2B-2C.

Due to an arrangement such as this, the threshold voltage of the first load transistor $ML_L$ depends on the biasing of the gate of the first conduction transistor $MD_L$.

Transistors $ML_R$ and $MA_L$ likewise have an arrangement similar to that of the first transistor $T_{11}$ and the second transistor $T_{21}$, respectively, of the exemplary device described previously in connection with FIGS. 2B-2C.

Transistors $ML_R$, $MA_L$, are arranged such that the channel region of the first access transistor $MA_L$ is situated above and opposite the gate of the second load transistor $ML_R$ and is coupled thereto.

Transistors $ML_L$ and $MA_R$ likewise have an arrangement similar to that of the first transistor $T_{11}$ and the second transistor $T_{21}$, respectively, of the exemplary device described previously in connection with FIGS. 2B-2C.

Due to an arrangement such as this, the threshold voltage of the second access transistor $MA_R$ depends on the biasing of the gate of the first load transistor $ML_L$.

As shown in FIGS. 6B and 6C, the transistors $MD_L$, $MD_R$, $MA_L$, $MA_R$, $ML_L$, $ML_R$ in the memory cell 300 are formed as a stack of thin layers and distributed over 3 different levels N1, N2, N3 of the stack, the conduction transistors $MD_L$ and $MD_R$ being situated in a single first level $N_1$ of the stack, while the load transistors $ML_L$ and $ML_R$ are situated above the conduction transistors, in a single second level $N_2$ of the stack, the access transistors $MA_L$, $MA_R$ being situated above the load transistors $ML_L$ and $ML_R$ in a single third level N3 of the stack.

One mode of operation of the cell 300 is as follows:

In read mode, the bit lines $BL_L$, $BL_R$, are placed at ground potential VSS, while the word line WL is likewise maintained at this potential VSS, in order to the data stored in the storage nodes L, R, via the bit lines $BL_L$ and $BL_R$. The access transistors $MA_L$ and $MA_R$ are then in a conductive state. In the case wherein the first node L is at a high logic level, e.g., at potential Vdd, and wherein the second node R is at a low logic level, e.g., at 0 V, the second conduction transistor $MD_R$ and the first load transistor $ML_L$ are likewise conductive, while the first conduction transistor $MD_L$ and the second load transistor $ML_R$ are blocked. In order to maintain the potential of the first node L close to Vdd, an $I_{MAL-ON}$ current is provided, which passes through the first access transistor $MA_L$, and which is lower than the $I_{MLL-ON}$ current, which passes through the first load transistor $ML_L$:

$$I_{MAL-ON} < I_{MLL-ON}$$

In this example, due to the configuration of cell 300, the first load transistor $ML_L$ has a low threshold voltage, thereby making it possible to increase the IMLL-ON current and to increase the read noise margin (SNM).

In write mode, the word line WL is biased at VSS in order to access the data stored in the storage nodes L, R, via the bit lines $BL_L$ and $BL_R$. The access transistors $MA_L$ and $MA_R$ are then in a conductive state. In the case wherein the first node L is at a high logic level, e.g., at potential Vdd, and wherein the second node R is at a low logic level, e.g., at 0 V, the second conduction transistor $MD_R$ and the first load transistor $ML_L$ are likewise conductive, while the first conduction transistor $MD_L$ and the second load transistor $ML_R$ are blocked. In the case wherein it is desired to write a 0, the first bit line $BL_L$ is maintained at 0 V and the second bit line $BL_R$ is biased at Vdd. In order to load the second storage node R at Vdd, an IMAR-ON current is provided for, which passes through the second access transistor $MA_R$ and which is higher than the IMDR-ON current which passes through the second conduction transistor MDR:

$$I_{MAR-ON} > I_{MDR-ON}$$

In this example, due to the configuration of cell 300, the second access transistor $MA_R$ has a low threshold voltage $V_T$, thereby making it possible to increase the IMAR-ON current and to increase the write margin (WM).

In addition to having an improved integration density, a cell 300 such as this has a better compromise between the write margin WM and the read stability margin SNM, than does a 6T memory according to the prior art.

A fourth exemplary random access memory cell 400 according to the invention is shown in FIGS. 7A-7C.

Memory cell 400 is likewise a 6T-type SRAM static random access memory cell. In this example, the access transistors MAL, MAR are NMOS-type transistors.

Cell 400 differs from the previously described cell by the arrangement of the conduction transistors MDL and MDR and the load transistors $ML_L$ and $ML_R$.

In memory cell 400, the load transistors $ML_L$, $ML_R$ are formed in a first level N1 of a stack of layers, while transistors $MD_L$, $MD_R$ are formed in a second level N2 of the stack, which is situated above the first level N1, the access transistors $MA_L$, $MA_R$ being formed in a third level N3, which is situated above the second level N2.

The arrangement of the access transistors $MA_L$, $MA_R$, in relation to the load transistors $ML_L$, $ML_R$ is such that the threshold voltage of the first access transistor MAL depends on the biasing of the gate of the second conduction transistor $MD_R$, while the threshold voltage of the second access transistor $MA_R$, depends on the biasing of the gate of the first conduction transistor $MD_L$.

The arrangement of the conduction transistors $MD_L$, $MD_R$, in relation to the load transistors $ML_L$, $ML_R$ is such that the threshold voltage of the first conduction transistor $MD_L$ depends on the biasing of the gate of the first load transistor $ML_L$, while the threshold voltage of the second conduction transistor $MD_R$, depends on the biasing of the gate of the second load transistor $ML_R$.

One mode of operation of cell 400 is as follows:

In read mode, the bit lines $BL_L$, $BL_R$ are placed at potential VDD, while the word line WL is likewise maintained at VDD in order to access the data stored in the storage nodes L, R, via the bit lines $BL_L$ and $BL_R$. The access transistors $MA_L$ and $MA_R$ are then in a conductive state. In the case wherein the first node L is at a high logic level, e.g., at potential Vdd, and wherein the second node R is at a low logic level, e.g., at 0 V, the second conduction transistor $MD_R$ and the first load transistor $ML_L$ are likewise conductive, while the first conduction transistor $MD_L$ and the second load transistor $ML_R$ are blocked. In order to maintain the potential of the second node R close to 0 V, and $I_{MAR-ON}$ current is provided for, which passes through the second access transistor $MA_R$, and which is lower than the $I_{MDR-ON}$ current, which passes through the second conduction transistor $MD_R$:

$$I_{MAR-ON} < I_{MDR-ON}$$

In this example, due to the configuration of cell 400, the second conduction transistor $MD_R$ has a low threshold voltage, which thereby makes it possible to increase $I_{MDR-ON}$ and to increase the read noise margin (SNM).

In write mode, the word line WL is biased at VDD in order to access the data stored in the storage nodes L, R, via the bit lines $BL_L$ and $BL_R$. The access transistors $MA_L$ and $MA_R$ are then in a conductive state. In the case wherein the first node L is at a high logic level, e.g., at potential Vdd, and wherein the second node R is at a low logic level, e.g., at 0 V, the second conduction transistor $MD_R$ and the first load transistor $ML_L$ are likewise conductive, while the first conduction transistor $MD_L$ and the second load transistor $ML_R$ are blocked. In the case wherein it is desired to write a 0, the first bit line $BL_L$ is biased at 0 V and the second bit line $BL_R$ is maintained at VDD. In order to unload the first node L at 0 V, an $I_{MAL-ON}$ current is provided, which passes through the first access transistor $MA_L$ and which is higher than the $I_{MLL-ON}$ current, which passes through the first conduction transistor $ML_L$:

$$I_{MAL-ON} > I_{MLL-ON}$$

In this example, due to the configuration of cell 400, $MA_L$ has a low threshold voltage $V_T$, which thereby makes it possible to increase $I_{MAL-ON}$ and to increase the write margin (WM).

A cell 400 such as this has a better compromise between the write margin WM and read stability SNM, than does a 6T memory cell according to the prior art, as well as an improved integration density.

A fifth exemplary random access storage cell 500 according to the invention is shown in FIGS. 8A-8C.

This cell 500 is likewise a 6T-type SRAM static random access memory cell.

Cell 500 includes a plurality of transistors $MD_L$, $MD_R$, $ML_L$, $ML_R$ forming a first inverter $INV_L$ and a plurality of transistors $MD_L$, $MD_R$, $ML_L$, $ML_R$ forming a second inverter $INV_R$.

Cell 500 differs from the previously described cell by the arrangement of the conduction $MD_L$ and $MD_R$ and load $ML_L$ and $ML_R$ transistors, which, this time, are made at the same level of a stack of thin layers, the access transistors $MA_L$ and $MA_R$ being made at a higher level (FIGS. 8B and 8C).

One mode of operation of cell 500 is as follows:

In write mode, the word line WL is biased at VDD in order to access the data stored in the storage nodes L, R, via the bit lines $BL_L$ and $BL_R$. The access transistors $MA_L$ and $MA_R$ are then in a conductive state. In the case wherein the first node L is at a high logic level, e.g., at potential Vdd, and wherein the second node R is at a low logic level, e.g., at 0 V, the second conduction transistor $MD_R$ and the first load transistor $ML_L$ are likewise conductive, while the first conduction transistor $MD_L$ and the second load transistor $ML_R$ are blocked. In the case wherein it is desired to write a 0, the first bit line $BL_L$ can be biased at 0 V and the second bit line $BL_R$ maintained at VDD. In order to unload the first node L at 0 V, an $I_{MAL-ON}$ current is provided, which passes through the first access transistor $MA_L$ and which is higher than the $I_{MLR-ON}$ current, which passes through the first conduction transistor $ML_L$:

$$I_{MAL-ON} > I_{MLL-ON}$$

In this example, due to the configuration of cell 500, $MA_L$ has a low threshold voltage $V_T$, which thereby makes it possible to increase $I_{MAL-ON}$ and to increase the write margin (WM).

By improving the write margin, a cell 500 such as this has a better compromise between the write margin WM and read stability SNM, than does a 6T memory cell according to the prior art, as well as an improved integration density.

A sixth exemplary static random access memory cell 600 according to the invention is shown in FIGS. 9A-9C.

This memory cell 600 is a dual-port type of SRAM static memory equipped with 8 transistors. Cell 600 includes a plurality of transistors forming a first inverter $INV_L$ and a second inverter $INV_R$, which are connected together in a flip-flop configuration. In this example, the flip-flop is formed by a first conduction transistor $MD_L$ and a second conduction transistor $MD_R$, of the NMOS type, for example, as well as by a first load transistor $ML_L$ and a second load transistor $ML_R$, of the PMOS type, for example.

Cell 600 is likewise equipped with a first access transistor $MA_{L1}$, a second access transistor $MA_{L2}$, a third access transistor $MA_{R1}$, and a fourth access transistor $MA_{R2}$.

The first access transistor $MA_{L1}$ is connected between a first bit line $BL_{L1}$ and a first node L, while the second access transistor $MA_{L2}$ is connected between a second bit line $BL_{L2}$ and said first node L.

The third access transistor $MA_{R1}$ is connected between a third bit line $BL_{R1}$ and a second node R, while the fourth access transistor $MA_{R2}$ is connected between a fourth bit line $BL_{R2}$ and the second node R.

The first access transistor $MA_{L1}$ and the second access transistor $MA_{L2}$ thus enable access to the first node L of cell 600, while the third access transistor $MA_{R1}$ and the fourth access transistor $MA_{R2}$ enable access to the second node R of cell 600.

The first access transistor $MA_{L1}$ and the third access transistor $MA_{R1}$ comprise a gate, which is connected to a first word line WL, while the second access transistor $MA_{L2}$ and the fourth access transistor $MA_{R2}$ comprise a gate, which is connected to a second word line $WL_2$.

As shown in FIGS. 9B and 9C, in memory cell 600, the transistors $MD_L$, $MD_R$, $MA_L$, $MA_R$, $ML_L$, $ML_R$ are formed in a stack of thin layers and distributed over 2 different levels N1, N2 of the stack, the conduction $MD_L$ and $MD_R$ and load $ML_L$ and $ML_R$ transistors being situated beneath the access transistors $MA_{L1}$, $MA_{L2}$, $MA_{R1}$, $MA_{R2}$ in the stack.

The access transistors each have an arrangement similar to that of the second transistor $T_{21}$ of the exemplary device described previously in connection with FIGS. 2B-2C, and are each formed above and opposite the gate of one of the transistors forming the inverters $INV_L$ and $INV_R$.

The arrangement of the first access transistor $MA_{L1}$ and the second access transistor $MA_{L2}$, in relation to the transistors of the second inverter $INV_R$, is such that the first access transistor $MA_{L1}$ has a channel region which is coupled with the gate of a transistor of the second inverter $INV_R$, while the second access transistor $MA_{L2}$ has a channel region which is coupled with the gate of a transistor of the second inverter $INV_R$.

The arrangement of the third access transistor $MA_{R1}$ and fourth access transistor $MA_{R2}$, in relation to the transistors of the first inverter $INV_L$, is such that the third access transistor $MA_{R1}$ has a channel region which is coupled with the gate of a transistor of the first inverter $INV_L$, while the fourth access transistor $MA_{R2}$ has a channel region which is coupled with the gate of a transistor of the first inverter $INV_L$.

A cell such as this comprises the inverters $INV_R$ and $INV_L$ in a first level of a stack of layers, and access transistors $MA_{L1}$, $MA_{L2}$, $MA_{R1}$, $MA_{R2}$ in a second level of said stack.

One mode of operation of cell 600 is as follows:

In write mode, the word line $WL_1$, $WL_2$) is biased at VDD, in order to access the data stored in the storage nodes L, R, via the bit lines $BL_{L1}$, $BL_{R1}$) and $BL_{R1}$ ($BL_{R2}$), respectively, while the word line $W_{L2}$, $W_{L1}$) is biased at 0 V. Access transistors $MA_{L1}$, $MA_{L2}$ and $MA_{R1}$, $MA_{R2}$ are then in a conductive state, while access transistors $MA_{L2}$, $MA_{L2}$ and $MA_{R2}$, $MA_{R1}$ are in a blocked state. In the case wherein the first node L is at a high logic level, e.g., at potential Vdd, and wherein the second node R is at a low logic level, e.g., at 0 V, the second conduction transistor $MD_R$ and the first load transistor $ML_L$ are likewise conductive, while the first conduction transistor $MD_L$ and the second load transistor $ML_R$ are blocked. In the case wherein it is desired to write a 0, the first bit line $BL_{L1}$ is biased at 0 V and the third bit line $BL_{R1}$ is maintained at VDD. In order to unload the first storage node L at 0 V, an $I_{MAL-ON}$ current is provided, which passes through the first access transistor $MA_{L1}$, and which is higher than the $I_{MLR-ON}$ current, which passes through the first conduction transistor $ML_L$:

$$I_{MAL1-ON} > I_{MLL-ON}$$

In this example, due to the configuration of cell 600, the first (second) access transistor $MAL_1$ ($MAL_2$) has a low $V_T$, which increases $I_{MAL-ON}$ and increases the write margin (WM).

By improving the write margin, a cell 600 such as this has a better compromise between the write margin WM and read stability SNM, than does an 8-transistor, dual-port memory cell according to the prior art, as well as an improved integration density.

A seventh exemplary random access memory cell 700 according to the invention is shown in FIGS. 10A-10B.

The memory cell 700 is also a 6T-type SRAM static memory.

In memory cell 700, the load transistors $ML_L$, $ML_R$ are formed in the first level N1 of a stack of layers, while the conduction transistors $MD_L$, $MD_R$ are formed in a second level N2 of the stack, which is situated above the first level N1, the access transistors $MA_L$, $MA_R$, likewise being formed in the second level N2.

The arrangement of the access transistors $MA_L$, $MA_R$ in relation to the load transistors $ML_L$, $ML_R$ is such that the threshold voltage of the first access transistor $MA_L$ depends on the biasing of the gate of the second load transistor $ML_R$, while the threshold voltage of the second access transistor $MA_R$ depends on the biasing of the gate of the first load transistor $ML_L$.

A coupling, on one hand, between the gate of the first load transistor $ML_L$ and the channel of the second access transistor $MA_R$, and on the other hand between the gate of the first load transistor $ML_L$ and the channel of the first drive transistor $MD_L$ is represented by doted line on FIG. 10A.

A coupling, on one hand, between the gate of the second load transistor $ML_R$ and the channel of the first access transistor $MA_L$, and on the other hand between the gate of the first load transistor $ML_L$ and the channel of the second drive transistor $MD_R$ is also represented by doted line on FIG. 10A.

The arrangement of the conduction transistors $MD_L$, $MD_R$ in relation to the load transistors $ML_L$, $ML_R$, is such that the threshold voltage of the first conduction transistor $MD_L$ depends on the biasing of the gate of the first load transistor $ML_L$, while the threshold voltage of the second conduction transistor $MD_R$ depends on the biasing of the gate of the second load transistor $ML_R$.

In this architecture, the node R can be better kept at a low logic level thanks to the manner the gate of load transistor $ML_L$ is biased.

The invention claimed is:

1. A static random access memory cell which, on a substrate surmounted by a stack of layers, comprising:
    a first plurality of transistors situated at a given level of the stack of which at least one first access transistor and at least one second access transistor are connected to a word line and are arranged between a first bit line and a first storage node and a second bit line and a second storage node, respectively; and
    a second plurality of transistors forming a flip-flop and situated at least one other level of the stack, beneath said given level,
    wherein the transistors of the second plurality of transistors each comprising a gate electrode situated opposite a channel region of a transistor of the first plurality of transistors and separated from this channel region by an insulating region provided to enable coupling of said gate electrode and said channel region,
    the second plurality of transistors is formed: from a first load transistor and a second load transistor, a first conduction transistor and a second conduction transistor, and
    the first load transistor, the second load transistor and the first conduction transistor and the second conduction transistor being formed in a single level of said stack.

2. The static random access memory cell of claim 1, wherein the second plurality of transistors is formed from the first conduction transistor having a gate situated opposite to and coupled to the channel region of the first access transistor, the second conduction transistor having a gate situated opposite to and coupled to the channel region of the second access transistor.

3. The static random access memory cell of claim 1, wherein the second plurality of transistors is formed from the first load transistor having a gate situated opposite to and coupled to the channel region of the first access transistor, the second load transistor having a gate situated opposite to and coupled to the channel region of the second access transistor.

4. The static random access memory cell of claim 1, wherein the first load transistor and the second load transistor are arranged opposite to and coupled to the second conduction transistor and first conduction transistor, respectively.

5. The static random access memory cell of claim 1, wherein the first plurality of transistors further includes at least one third access transistor and at least one fourth access transistor, which are arranged between a third bit line and the first storage node, and between a fourth bit line and the second storage node respectively, the third access transistor and the fourth access transistor having a gate connected to a second word line.

6. The static random access memory cell as claimed in claim 1, wherein said insulating region has an $SiO_2$ equivalent thickness of between 1 and 50 nanometers.

7. The static random access memory cell as claimed in claim 1, wherein the coupling is such that a variation in potential of said gate electrode results in a variation in the threshold voltage of said channel region.

8. The static random access memory cell as claimed in claim 7, wherein the cell has a supply voltage Vdd, and the coupling is such that a variation in the potential of said gate electrode of more than Vdd makes it possible to obtain a variation in the threshold voltage of said channel region of at least 50 mV.

9. The static random access memory cell as claimed in claim 1, wherein, between said gate electrode and said channel region, said insulating region is formed from a first region containing a first dielectric material having a first dielectric constant $k_1$, which is opposite source and drain regions, and said insulating region is formed from a second region comprising at least one second dielectric material having a second dielectric constant $k_2$ such that $k_2 < k_1$.

10. The static random access memory cell of claim 9, wherein said second region comprises a stacking of said first dielectric material and said second dielectric material.

11. A static random access memory cell which, on a substrate surmounted by a stack of layers, comprising:
    a first plurality of transistors situated at a given level of the stack of which at least one first access transistor and at least one second access transistor are connected to a word line and are arranged between a first bit line and a first storage node and a second bit line and a second storage node, respectively; and
    a second plurality of transistors forming a flip-flop and situated at least one other level of the stack, beneath said given level,
    wherein the transistors of the second plurality of transistors each comprising a gate electrode situated opposite a channel region of a transistor of the first plurality of transistors and separated from this channel region by an insulating region provided to enable coupling of said gate electrode and said channel region, and
    said insulating region has an $SiO_2$ equivalent thickness of between 1 and 50 nanometers.

12. The static random access memory cell of claim 11, wherein the second plurality of transistors is formed from a first conduction transistor and a second conduction transistor, the first conduction transistor having a gate situated opposite to and coupled to the channel region of the first access transistor, the second conduction transistor having a gate situated opposite to and coupled to the channel region of the second access transistor.

13. The static random access memory cell of claim 11, wherein the second plurality of transistors is formed from a first load transistor and a second load transistor, the first load transistor having a gate situated opposite to and coupled to the channel region of the first access transistor, the second load transistor having a gate situated opposite to and coupled to the channel region of the second access transistor.

14. The static random access memory cell of claim 11, wherein the second plurality of transistors is formed: from a first load transistor and a second load transistor, a first conduction transistor and a second conduction transistor.

15. The static random access memory cell of claim 14, wherein the first load transistor and the second load transistor are arranged opposite to and coupled to the second conduction transistor and first conduction transistor, respectively.

16. The static random access memory cell of claim 14, wherein the first load transistor, the second load transistor and the first conduction transistor and the second conduction transistor being formed in a single level of said stack.

17. The static random access memory cell of claim 11, wherein the first plurality of transistors further includes at least one third access transistor and at least one fourth access transistor, which are arranged between a third bit line and the first storage node, and between a fourth bit line and the second storage node respectively, the third access transistor and the fourth access transistor having a gate connected to a second word line.

18. The static random access memory cell as claimed in claim 11, wherein the coupling is such that a variation in potential of said gate electrode results in a variation in the threshold voltage of said channel region.

19. The static random access memory cell as claimed in claim 18, wherein the cell has a supply voltage Vdd, and the coupling is such that a variation in the potential of said gate electrode of more than Vdd makes it possible to obtain a variation in the threshold voltage of said channel region of at least 50 mV.

20. The static random access memory cell as claimed in claim 11, wherein, between said gate electrode and said channel region, said insulating region is formed from a first region containing a first dielectric material having a first dielectric constant $k_1$, which is opposite source and drain regions, and said insulating region is formed from a second region comprising at least one second dielectric material having a second dielectric constant $k_2$ such that $k_2 < k_1$.

21. The static random access memory cell of claim 20, wherein said second region comprises a stacking of said first dielectric material and said second dielectric material.

* * * * *